(12) United States Patent
Liu et al.

(10) Patent No.: US 11,545,527 B2
(45) Date of Patent: Jan. 3, 2023

(54) PIXEL ARRANGEMENT STRUCTURE, HIGH-PRECISION METAL MASK, AND DISPLAY APPARATUS WITH HEXAGON PIXEL ARRANGEMENT

(71) Applicant: BOE TECHNOLOGY GROUP CO., LTD., Beijing (CN)

(72) Inventors: Yue Liu, Beijing (CN); Yansong Li, Beijing (CN); Haohan Zhang, Beijing (CN); Shanshan Bai, Beijing (CN); Haidong Wu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 832 days.

(21) Appl. No.: 16/330,919

(22) PCT Filed: Aug. 31, 2018

(86) PCT No.: PCT/CN2018/103547
§ 371 (c)(1),
(2) Date: Mar. 6, 2019

(87) PCT Pub. No.: WO2019/153727
PCT Pub. Date: Aug. 15, 2019

(65) Prior Publication Data
US 2021/0384268 A1    Dec. 9, 2021

(30) Foreign Application Priority Data
Feb. 9, 2018 (CN) .......................... 201810134245.1

(51) Int. Cl.
*H01L 27/32* (2006.01)
*H01L 51/00* (2006.01)
*G09G 3/3208* (2016.01)

(52) U.S. Cl.
CPC ....... *H01L 27/3218* (2013.01); *G09G 3/3208* (2013.01); *H01L 51/0011* (2013.01); *G09G 2300/0452* (2013.01)

(58) Field of Classification Search
CPC .............. G09G 3/3208; H01L 27/3216; H01L 27/3218
See application file for complete search history.

(56) References Cited

U.S. PATENT DOCUMENTS 4,491,863 A * 1/1985 Kurahashi ................ H04N 9/16
                                                            348/808
6,768,482 B2 * 7/2004 Asano .................. H01L 27/3211
                                                            345/90

(Continued)

FOREIGN PATENT DOCUMENTS

CN     104050889 A    9/2014
CN     104362170 A    2/2015
(Continued)

OTHER PUBLICATIONS

International Search Report dated Oct. 31, 2018, issued in counterpart application No. PCT/CN2018/103547. (10 pages).

*Primary Examiner* — Kwang-Su Yang
(74) *Attorney, Agent, or Firm* — WHDA, LLP (57) ABSTRACT

A pixel arrangement structure may include a plurality of repeating units (100). Each of the plurality of the repeating units (100) may include a first sub-pixel (01) being at a center point of a virtual hexagon and second sub-pixels (02) and third sub-pixels (03) being alternately arranged at vertices of the virtual hexagon. Virtual hexagons of adjacent repeating units may share one common side as well as two sub-pixels on the common side.

15 Claims, 9 Drawing Sheets

(56) References Cited

U.S. PATENT DOCUMENTS

| | | | |
|---|---|---|---|
| 8,598,784 B2* | 12/2013 | Ko | G09G 3/3208 |
| | | | 313/504 |
| 9,523,900 B2* | 12/2016 | Morinaga | G02F 1/133784 |
| 10,026,785 B2 | 7/2018 | Bai et al. | |
| 2015/0348470 A1 | 12/2015 | Wang et al. | |
| 2016/0343284 A1* | 11/2016 | Sun | H01L 27/3218 |
| 2016/0358985 A1* | 12/2016 | Bai | H01L 51/50 |
| 2016/0370919 A1* | 12/2016 | Xu | G06F 3/04166 |

FOREIGN PATENT DOCUMENTS

| | | | |
|---|---|---|---|
| ES | 2335834 | B1 | 2/2011 |
| JP | 5510723 | B2 | 6/2014 |

* cited by examiner

PIXEL ARRANGEMENT STRUCTURE, HIGH-PRECISION METAL MASK, AND DISPLAY APPARATUS WITH HEXAGON PIXEL ARRANGEMENT

CROSS-REFERENCE TO RELATED APPLICATIONS

This application claims benefit of the filing date of Chinese Patent Application No. 201810134245.1 filed on Feb. 9, 2018, the disclosure of which is hereby incorporated in its entirety by reference.

TECHNICAL FIELD

This disclosure relates to display technology, and more particularly, to a pixel arrangement structure, a high-precision metal mask, and a display apparatus.

BACKGROUND

Compared with liquid crystal display apparatuses, Organic Light Emitting Diode (OLED) display apparatuses have low energy consumption, low production cost, self-luminescence, wide viewing angle, quick response speed, and other advantages. At present, in the field of flat panel displays such as mobile phones, PDAs, and digital cameras, OLED display apparatuses have begun to replace the traditional liquid crystal display (LCD) apparatuses.

The structure of the OLED display apparatus mainly includes a base substrate and sub-pixels arranged in an array on the base substrate. Each of the sub-pixels is generally made of organic material and formed by an evaporation film-forming technique using a high-precision metal mask. Organic electroluminescent structures are formed at corresponding sub-pixel positions on the array substrate.

Since the sizes of the sub-pixels are directly determined by the sizes of the openings of the high-precision metal mask, there is a limitation in the manufacturing process for the high-precision metal mask. It is very difficult to manufacture a high-resolution display apparatus using the conventional RGB pixel arrangement structure.

BRIEF SUMMARY

An embodiment of the present disclosure provides a pixel arrangement structure. The pixel arrangement structure may include a plurality of repeating units. Each of the plurality of the repeating units may include a first sub-pixel being at a center point of a virtual hexagon. Second sub-pixels and third sub-pixels may be alternately arranged at vertices of the virtual hexagon. Virtual hexagons of adjacent repeating units may share one common side as well as two sub-pixels on the common side.

In one embodiment, in the virtual hexagon, a minimum distance between the first sub-pixel and the second sub-pixel may be equal to a minimum distance between the first sub-pixel and the third sub-pixel. In one embodiment, in the virtual hexagon, a minimum distance between every adjacent second sub-pixel and third sub-pixel is equal. In one embodiment, in the virtual hexagon, opposite sides of the first sub-pixel and the second sub-pixel are parallel to each other. In one embodiment, in the virtual hexagon, opposite sides of the first sub-pixel and the third sub-pixel are parallel to each other. In one embodiment, in the virtual hexagon, opposite sides of the adjacent second sub-pixel and third sub-pixel are parallel to each other.

The virtual hexagon may be a virtual regular hexagon. An area of the first sub-pixel may be larger than an area of the second sub-pixel and an area of the first sub-pixel may be larger than an area of the third sub-pixel. In one embodiment, the area of the second sub-pixel may be equal to the area of the third sub-pixel. In one embodiment, the area of the third sub-pixel is larger than the area of the second sub-pixel.

In one embodiment, the first sub-pixel is a red sub-pixel, the second sub-pixel is a green sub-pixel, and the third sub-pixel is a blue sub-pixel. The first sub-pixel, the second sub-pixel, and the third sub-pixel each may have a shape of polygon. In one embodiment, the first sub-pixel, the second sub-pixel, and the third sub-pixel each have a shape of hexagon.

Placement angles of the first sub-pixel, the second sub-pixel, and the third sub-pixel may be the same. The first sub-pixel, the second sub-pixel, and the third sub-pixel each may have a different shape.

Another example of the present disclosure is a high-precision metal mask for fabricating the pixel arrangement structure according to one embodiment of the present disclosure. The high-precision metal mask may include a plurality of opening regions, and the opening regions may correspond to shapes and positions of one set of the first sub-pixels, the second sub-pixels or the third sub-pixels.

Another example of the present disclosure is a display apparatus. The display apparatus may include the pixel arrangement structure according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6c. When referring to the figures, like structures and elements shown throughout are indicated with like reference numerals.

The shapes and sizes of components in the drawings do not reflect true scale and are only intended to schematically illustrate content of the present disclosure.

Figure 1:
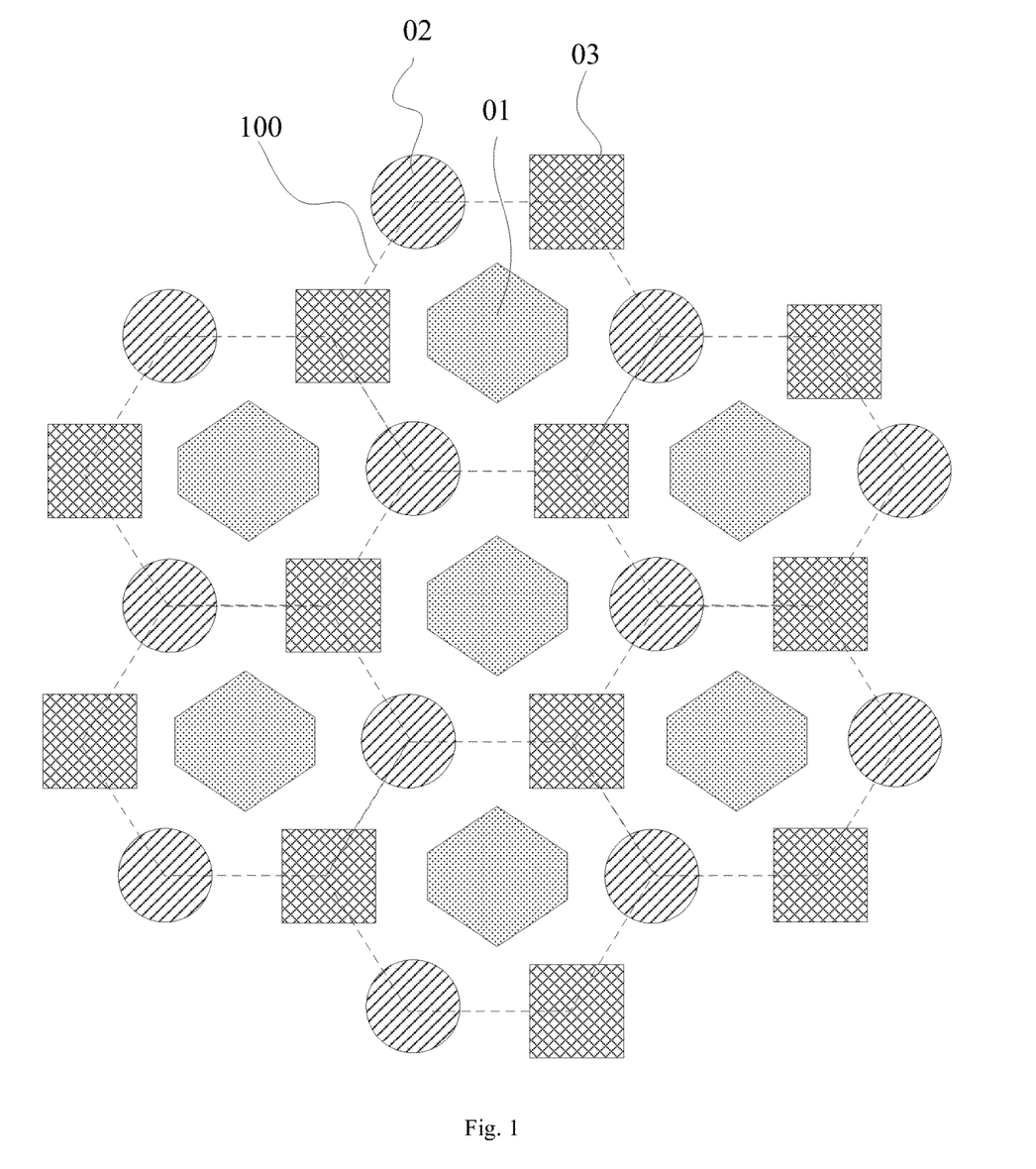
FIG. 1 is a schematic structural diagram of a pixel arrangement structure according to an embodiment of the present disclosure.
Figure 2:
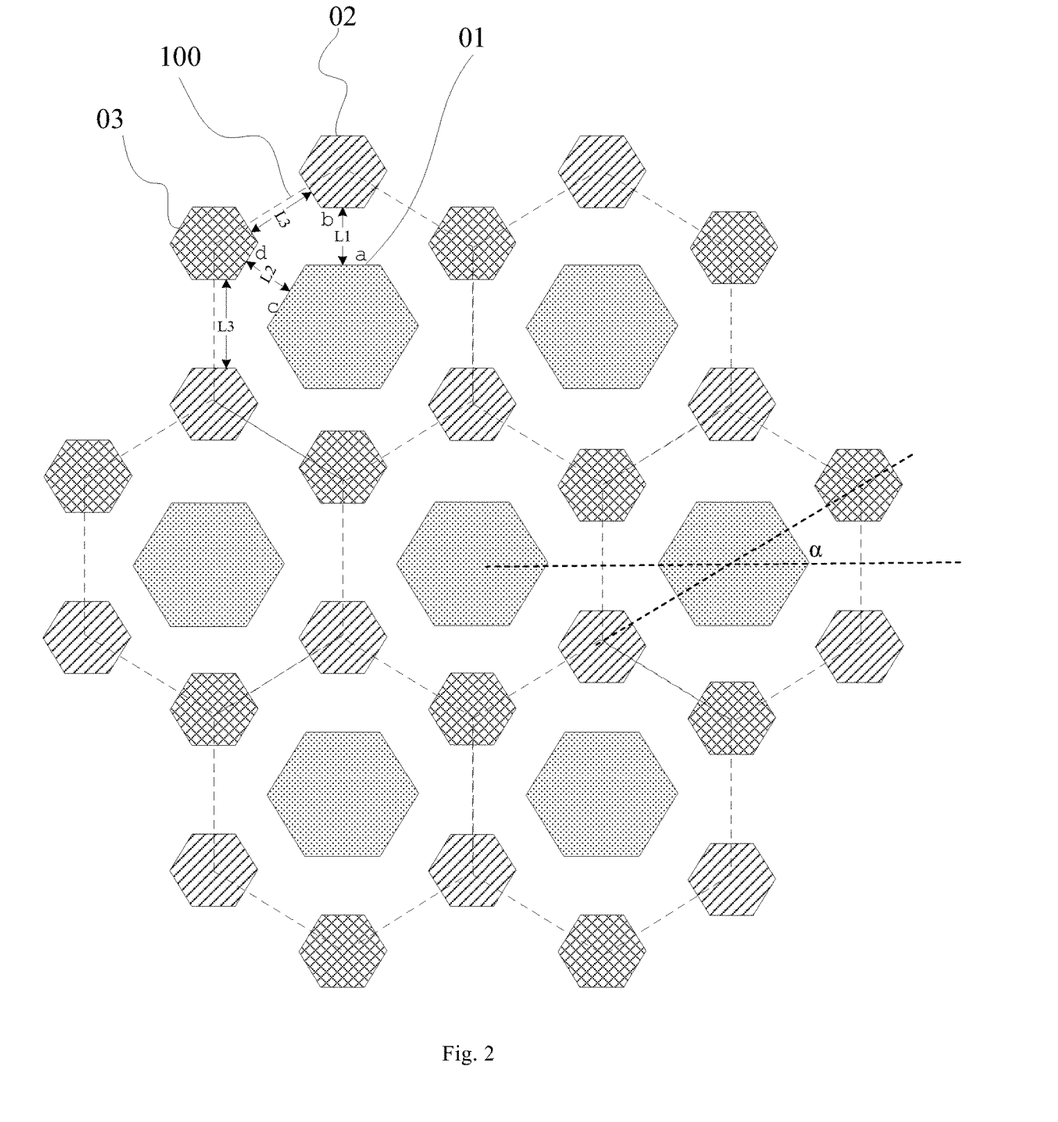
FIG. 2 is a schematic structural diagram of a pixel arrangement structure according to an embodiment of the present disclosure.
Figure 3:
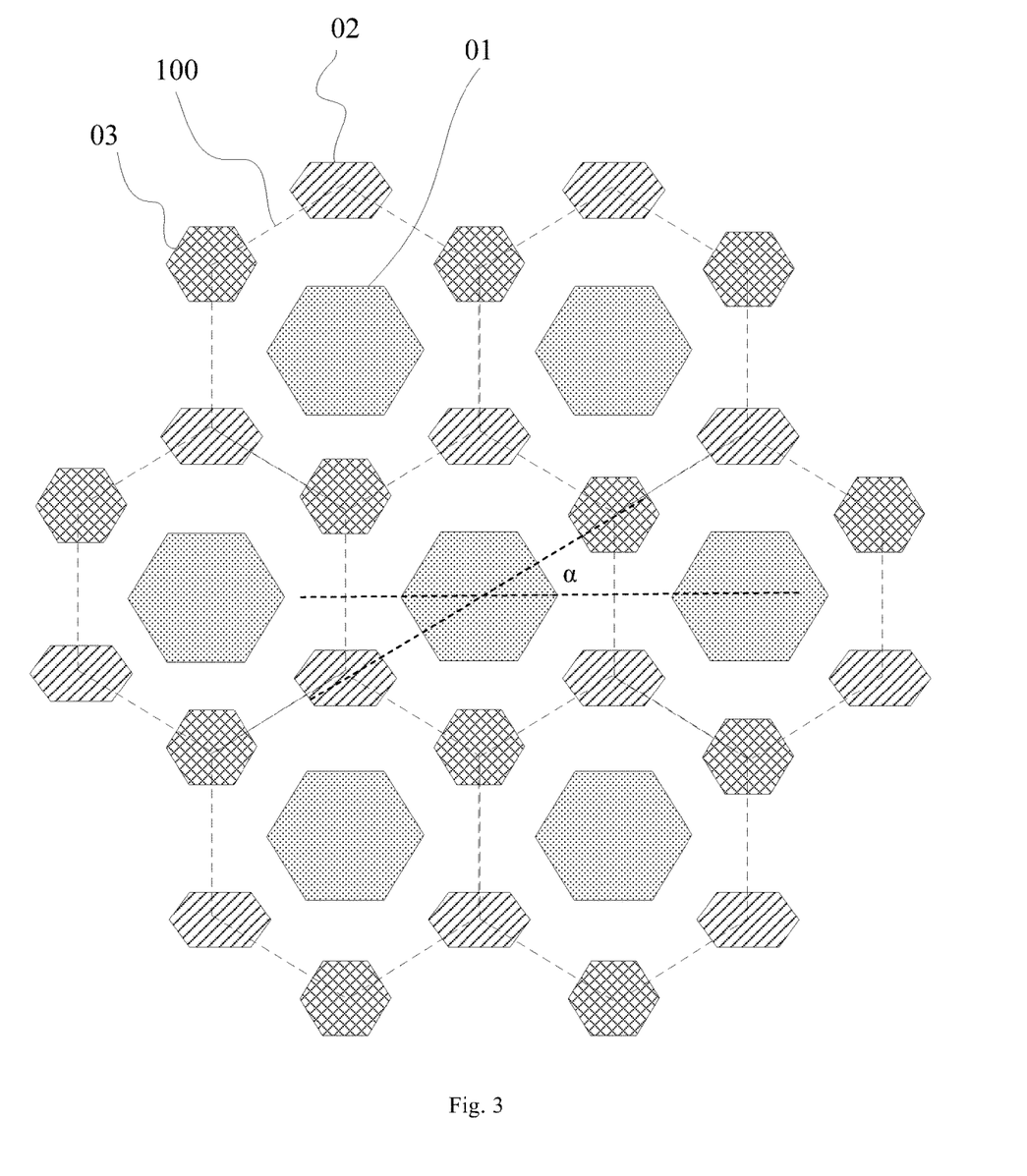
FIG. 3 is a schematic structural diagram of a pixel arrangement structure according to an embodiment of the present disclosure.

A pixel arrangement structure provided by an embodiment of the present disclosure, as shown in FIGS. 1 to 3, includes a plurality of closely-arranged repeating units 100. The repeating unit 100 includes a first sub-pixel 01 located at a center point of a virtual hexagon, second sub-pixels 02 and third sub-pixels 03 alternately arranged at vertices of the virtual hexagon.

The adjacent repeat units 100 are closely arranged in such a manner that they share one common side as well as the two sub-pixels 02 and 03 located on the common side.

Figure 5A:
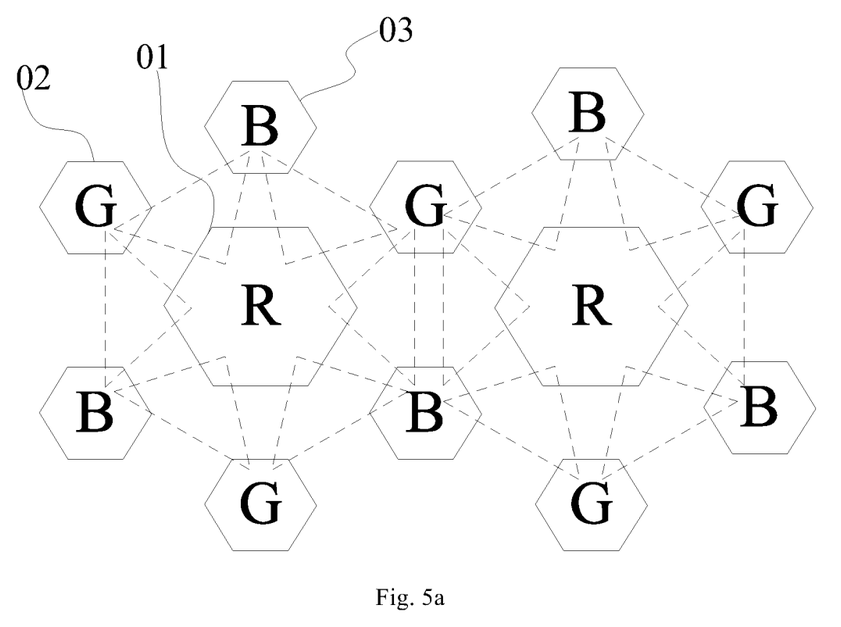
FIG. 5a is a schematic diagram of sub-pixels in a pixel arrangement structure provided by an embodiment of the present disclosure.

In the pixel arrangement structure provided by one embodiment of the present disclosure, the second sub-pixels 02 and the third sub-pixels 03 are alternately arranged at the vertices of the virtual hexagon, the first sub-pixel 01 is located at the central point of the virtual hexagon, and the adjacent virtual hexagons are arranged in such a way that they share one common side. As shown in FIG. 5, when displayed, the first sub-pixel 01 located at the center point of the virtual hexagon together with the third sub-pixel 03 and the second sub-pixel 02 located at any two adjacent vertices of the virtual hexagon (such as three sub-pixels covered by the dotted triangle in FIG. 5) may form one light-emitting pixel point. As such, the sub-pixels can achieve high resolution display effect from a low physical resolution based on principle of color-borrowing.

It should be noted that, in the foregoing pixel arrangement structure provided by the embodiment of the present disclosure, the sub-pixel being located at a certain point refers to a range of sub-pixel positions where the sub-pixel overlaps the certain point. In one embodiment, the center of the sub-pixel overlaps the certain point. In another embodiment, the center of the sub-pixel does not overlap the certain point, that is, there is a deviation between them, which is not limited herein. In one embodiment, the center of the sub-pixel is a geometric center of the sub-pixel pattern.

Compared with the existing pixel arrangement structure, the pixel arrangement structure provided by the embodiment of the present disclosure can arrange the first sub-pixels 01, the second sub-pixels 02, and the third sub-pixels 03 more closely under the same processing conditions. As such, under the premise of ensuring minimum sub-pixel intervals, an area of each single sub-pixel can be increased as much as possible, thereby reducing the driving current of the display apparatus and accordingly the lifetime of the display apparatus.

It should be noted that, in the pixel arrangement structure provided in the embodiments of the present disclosure, the placement angle of the virtual hexagon is not limited, and it can rotate freely around the center point, which is not limited herein. The placement angle of a hexagon is the smallest acute angle between a diagonal line connecting two opposite vertices of the hexagon and a first direction such as a row direction. For example, the diagonal line connecting two opposite vertices of the virtual hexagon is parallel to the row direction in FIG. 1. Accordingly, the placement angle of the virtual hexagon, α, is 0 in FIG. 1. In contrast, the placement angles, α, of the virtual hexagons in FIG. 2 and FIG. 3 are not zero, as shown in FIG. 2 and FIG. 3.

Optionally, in the pixel arrangement structure provided in one embodiment of the present disclosure, the virtual hexagon is a virtual regular hexagon so as to ensure uniform distribution of the sub-pixels.

Figure 4:
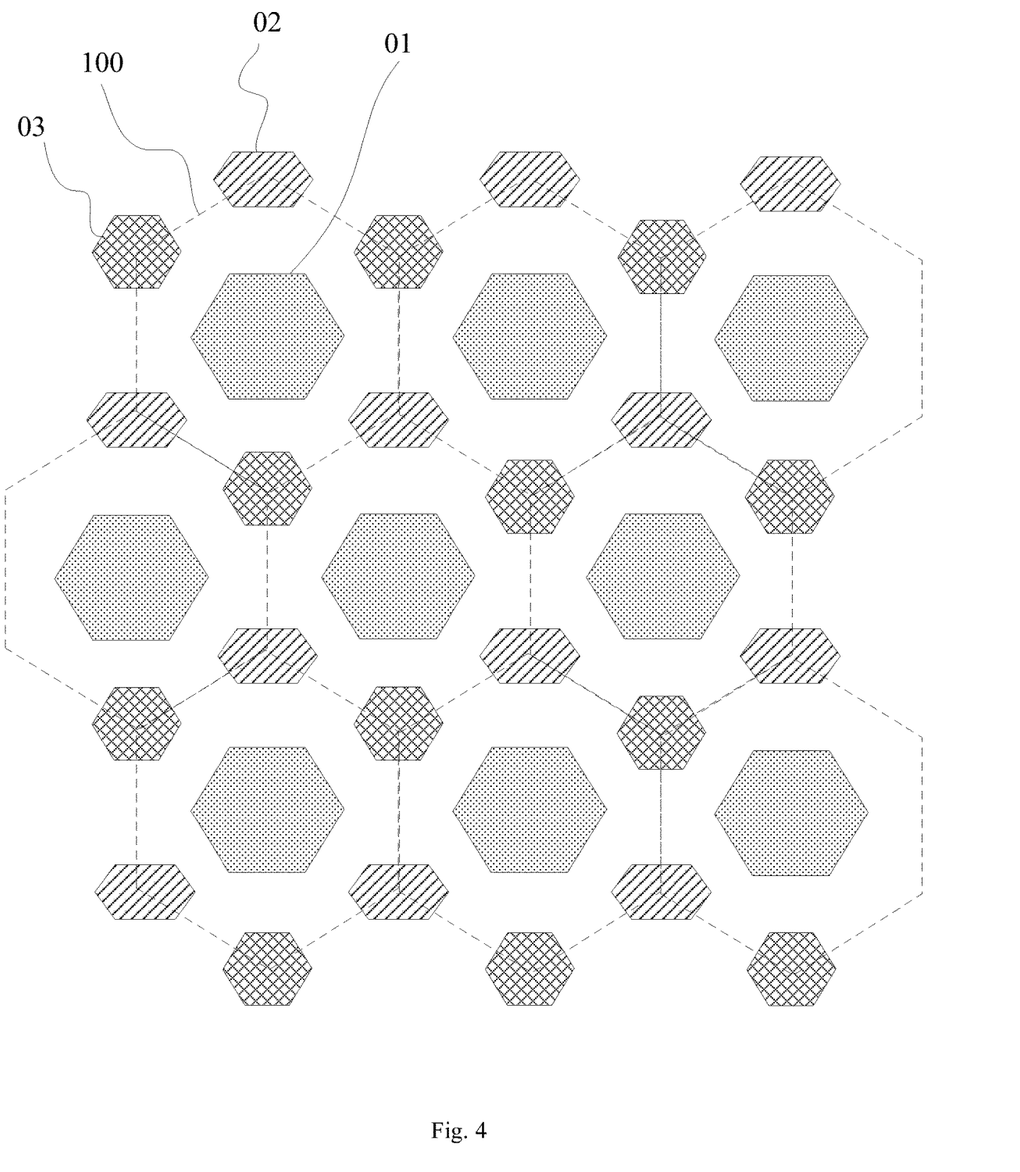
FIG. 4 is a schematic structural diagram of a pixel arrangement structure in a display panel according to an embodiment of the present disclosure.

It should be noted that the pixel arrangement structure provided by the embodiment of the present disclosure generally refers to arrangement of the pixel repeating units located in the central area of the display panel. There may appear some special circumstances at the edge of the display panel. For example, as shown in FIG. 4, at the edge of the display panel, sub-pixels may be arranged only at some of the vertices or the center point of the virtual hexagon.

Optionally, in the pixel arrangement structure provided in one embodiment of the present disclosure, as shown in FIGS. 1 to 3, the shapes of the first sub-pixel 01, the second sub-pixel 02, and the third sub-pixel 03 are all polygons such as rectangles, pentagons, regular hexagons, regular octagons, etc. Of course, in the specific implementation, the shapes of the first sub-pixel 01, the second sub-pixel 02 or the third sub-pixel 03 may also be a regular pattern such as a circle or an ellipse, or an irregular pattern, which is not limited herein.

Optionally, in order to reduce difficulty of vapor deposition, in the pixel arrangement structure provided in one embodiment of the present disclosure, the shapes of the first sub-pixel 01, the second sub-pixel 02, and the third sub-pixel 03 are all polygons with round corners.

Optionally, in the pixel arrangement structure provided in one embodiment of the present disclosure, as shown in FIGS. 1 to 3, except for the sub-pixels at the edges, each sub-pixel near the central area of the pixel structure is actually surrounded by six sub-pixels. In order to make the sub-pixels closely arranged, as shown in FIG. 2 and FIG. 3, the shapes of the first sub-pixel 01, the second sub-pixel 02, and the third sub-pixel 03 are all hexagons.

Optionally, in the pixel arrangement structure provided in one embodiment of the present disclosure, as shown in FIG. 2 and FIG. 3, the shapes of the first sub-pixel 01, the second sub-pixel 02, and the third sub-pixel 03 are all parallel hexagon. That is, the placement angles of the first sub-pixel 01, the second sub-pixel 02, and the third sub-pixel 03 are the same (Added). Specifically, the smallest acute angle between a diagonal line connecting two opposite vertices of the first sub-pixel and a first direction such as a row direction is zero. The smallest acute angle between a diagonal line connecting two opposite vertices of the second sub-pixel and a first direction such as a row direction is zero. The smallest acute angle between a diagonal line connecting two opposite vertices of the third sub-pixel and a first direction such as a row direction is zero.

Further, in the pixel arrangement structure provided in one embodiment of the present disclosure, as shown in FIG. 2, the shapes of the first sub-pixel 01, the second sub-pixel 02, and the third sub-pixel 03 are regular hexagons, which can ensure that the opposite sides of any adjacent sub-pixels are parallel to each other. The opposite sides of two sub-pixels are defined as one side of one of the two sub-pixels and one side of the other one of the two sub-pixels, and the two sides are closest to each other and opposite to each other. As shown in FIG. 2, the opposite sides of the first sub-pixel 01 and the second sub-pixel 02 are sides a and b respectively. The opposite sides of the first sub-pixel 01 and the third sub-pixel 03 are sides c and d respectively.

Optionally, in the pixel arrangement structure provided by one embodiment of the present disclosure, as shown in FIG. 2 and FIG. 3, the first sub-pixels 01 have the same placement angle. As such, the opening areas on the high precision metal mask corresponding to the first sub-pixels 01 can be evenly distributed, thereby avoiding stress concentration during vapor deposition and reducing difficulty of vapor deposition. Of course, in actual implementation, the placement angle of each first sub-pixel 01 may not be the same, which is not limited herein.

Optionally, in the pixel arrangement structure provided by one embodiment of the present disclosure, as shown in FIG. 2 and FIG. 3, the second sub-pixels 02 have the same placement angle. As such, the opening areas on the high precision metal mask corresponding to the second sub-pixels 02 can be evenly distributed, thereby avoiding stress concentration during vapor deposition and reducing difficulty of vapor deposition. Of course, in actual implementation, the placement angle of each second sub-pixel 02 may not be the same, which is not limited herein.

Optionally, in the pixel arrangement structure provided by one embodiment of the present disclosure, as shown in FIG. 2 and FIG. 3, the third sub-pixels 03 have the same placement angle. As such, the opening areas on the high precision metal mask corresponding to the third sub-pixels 03 can be evenly distributed, thereby avoiding stress concentration during vapor deposition and reducing difficulty of vapor deposition. Of course, in actual implementation, the placement angle of each third sub-pixel 03 may not be the same, which is not limited herein.

Optionally, in the pixel arrangement structure provided in one embodiment of the present disclosure, as shown in FIG. 2, the shapes of the first sub-pixel 01, the second sub-pixel 02, and the third sub-pixel 03 are the same, and the placement angles of the first sub-pixel 01, the second sub-pixel 02, and the third sub-pixel 03 are also the same.

Optionally, in the pixel arrangement structure provided in one embodiment of the present disclosure, the minimum distance between adjacent sub-pixels needs to be greater than or equal to the process limit distance to meet the process requirements.

Specifically, the process limit distance is generally related to the manufacturing process used. When a pixel pattern is formed by using a high-precision metal mask (FMM) and an etching process, the process limit distance is about 16 µm. When a pixel pattern is formed using a laser or electroforming process, the process limit distance is smaller.

Optionally, in the pixel arrangement structure provided in one embodiment of the present disclosure, within the virtual hexagon, as shown in FIG. 2, the minimum distance L1 between the first sub-pixel 01 and the second sub-pixel 02 is equal to the minimum distance L2 between the first sub-pixel 01 and the third sub-pixel 03 in order to ensure uniform distribution of sub-pixels. Certainly, in the specific implementation, the minimum distance L1 between the first sub-pixel 01 and the second sub-pixel 02 and the minimum distance L2 between the first sub-pixel 01 and the third sub-pixel 03 may not be equal, which is not limited herein.

Optionally, in the pixel arrangement structure provided by one embodiment of the present disclosure, as shown in FIG. 2, the minimum distance L3 between every adjacent second sub-pixel 02 and third sub-pixel 03 within the virtual hexagon is equal in order to ensure uniform distribution of sub-pixels. Of course, in the specific implementation, the minimum distance L3 between every adjacent second sub-pixel 02 and third sub-pixel 03 may not be equal, which is not limited herein.

Optionally, in the pixel arrangement structure provided by one embodiment of the present disclosure, in order to ensure that the distance between every adjacent second sub-pixel 02 and first sub-pixel 01 is the same, and reduce the distance between the adjacent second sub-pixel 02 and first sub-pixel 01, as shown in FIG. 2, the opposite sides of the adjacent first sub-pixel 01 and second sub-pixel 02 in the virtual hexagon are parallel to each other. Of course, in the specific implementation, the opposite sides of the adjacent first sub-pixel 01 and second sub-pixel 02 may not be parallel to each other, which is not limited herein.

Optionally, in the pixel arrangement structure provided by one embodiment of the present disclosure, in order to ensure that the distance between every adjacent third sub-pixel 03 and first sub-pixel 01 is the same and reduce the distance between the adjacent third sub-pixel 03 and first sub-pixel 01, as shown in FIG. 2, the opposite sides of the adjacent first sub-pixel 01 and third sub-pixel 03 in the virtual hexagon are parallel to each other. Of course, in the specific implementation, the opposite sides of the adjacent first sub-pixel 01 and third sub-pixel 03 may not be parallel to each other, which is not limited herein.

Optionally, in the pixel arrangement structure provided by the embodiment of the present disclosure, in order to ensure that the distance between every adjacent third sub-pixel 03 and second sub-pixel 02 is the same and reduce the distance between the adjacent third sub-pixel 03 and second sub-pixel 02, as shown in FIG. 2, the opposite sides of the adjacent second sub-pixel 02 and third sub-pixel 03 in the virtual hexagon are parallel to each other. Of course, in the specific implementation, the opposite sides of the adjacent second sub-pixel 02 and third sub-pixel 03 may not be parallel to each other, which is not limited herein.

Optionally, in the pixel arrangement structure provided in one embodiment of the present disclosure, the specific shapes, positional relationships, and the like of the first sub-pixels 01, the second sub-pixels 02, and the third sub-pixels 03 may be designed according to specific requirements. In the process, due to limitation of processing conditions or other factors, there may also be some deviations. Therefore, the shapes, positions, and relative positional relationships of the sub-pixels only substantially satisfy the above conditions, and they all belong to the scope of the pixel arrangement structure provided by the embodiments of the present disclosure.

Optionally, in the pixel arrangement structure provided by one embodiment of the present disclosure, since the sub-pixels located at the six vertices of the virtual hexagon all need to borrow the first sub-pixel, an area of the first sub-pixel is larger than an area of the second sub-pixel, and an area of the first sub-pixel is larger than an area of the third sub-pixel.

Optionally, in the pixel arrangement structure provided in one embodiment of the present disclosure, as shown in FIG. 5a, the first sub-pixel 01 is a red sub-pixel R, the second sub-pixel 02 is a green sub-pixel G, and the third sub-pixel 03 is a blue sub-pixel B. The red sub-pixel R together with the adjacent green sub-pixel G and blue sub-pixel B may form one light-emitting pixel point (three sub-pixels covered by the dashed triangle in FIG. 5). As such, the sub-pixels can achieve high resolution display effect from the low physical resolution based on principle of color-borrowing.

Figure 5B:
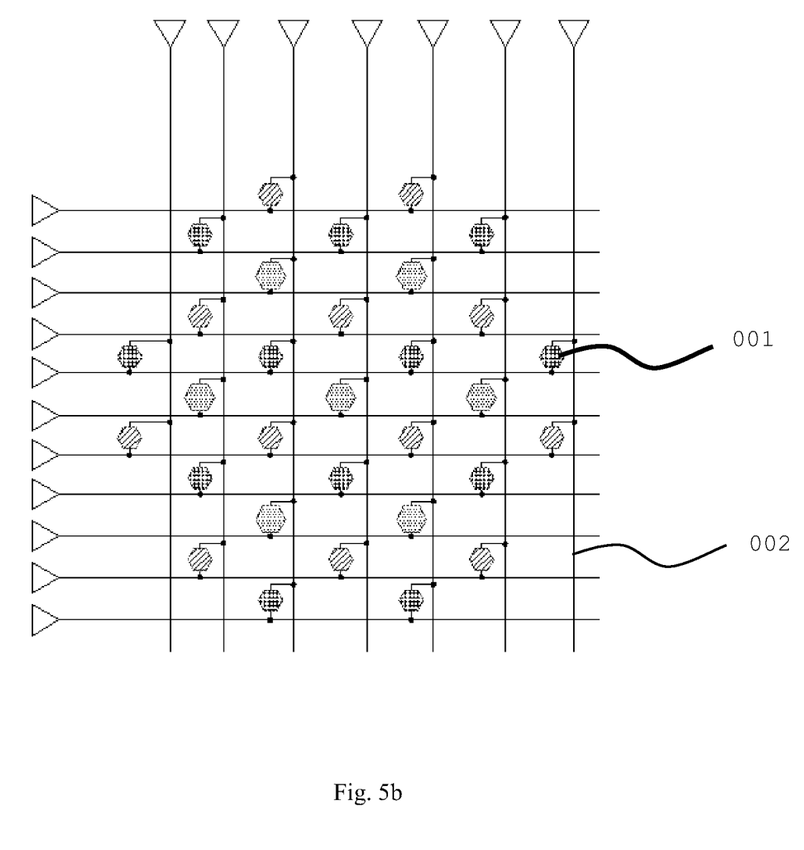
FIG. 5b is a schematic diagram of the driver arrangement corresponding to a sub-pixel arrangement according to one embodiment of the present disclosure.

FIG. 5a also shows a schematic diagram of sub-pixel borrowing in the pixel arrangement structure according to one embodiment of the present disclosure. In one embodiment, FIG. 5a shows six corners of a virtual hexagon when displaying a white light picture. The adjacent B and G pixels share the R pixel of the center, and the adjacent B and G pixels also use the neighboring R pixel to emit light. FIG. 5*b* is a schematic diagram of the driver arrangement corresponding to the sub-pixel arrangement in FIG. 2. The data line (002) scans the V data signal in rows, thereby achieving the purpose of independently controlling a single sub-pixel (001).

Optionally, in the pixel arrangement structure provided in one embodiment of the present disclosure, an area of the second sub-pixel is equal to an area of the third sub-pixel. In another embodiment, considering the lifetime of the device and material, an area of the third sub-pixel is larger than an area of the second sub-pixel, which is not limited herein.

Figure 6A:
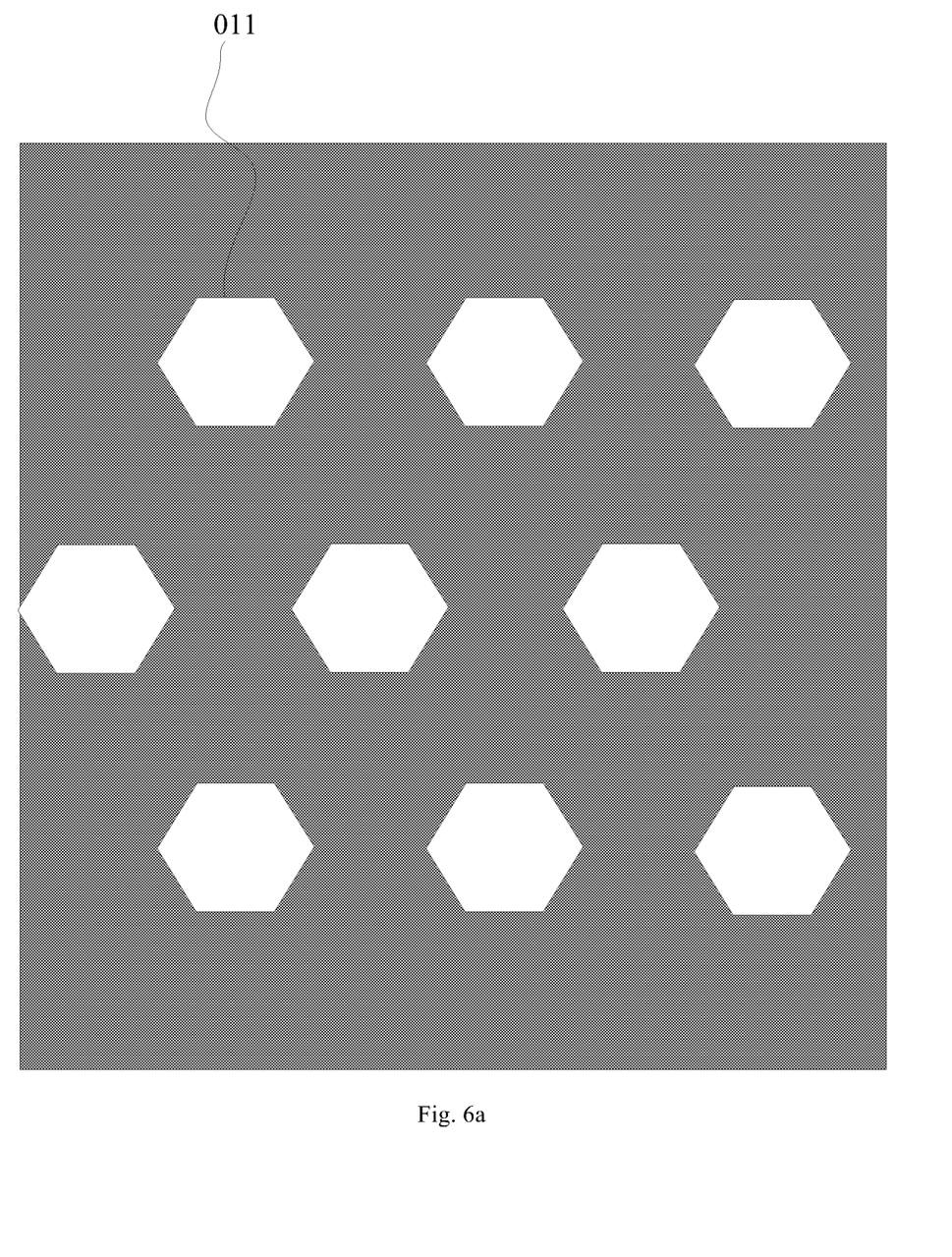
FIG. 6a is a schematic structural diagram of a high-precision mask corresponding to first sub-pixels provided by an embodiment of the present disclosure.
Figure 6B:
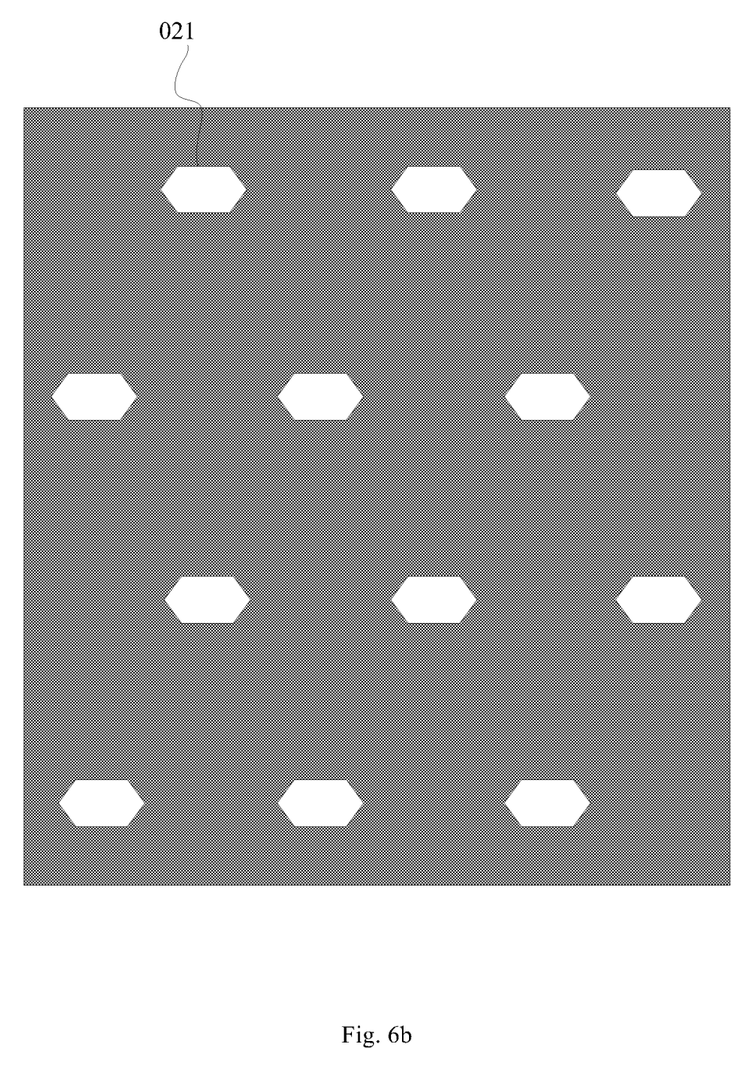
FIG. 6b is a schematic structural diagram of a high-precision mask corresponding to second sub-pixels according to an embodiment of the present disclosure.
Figure 6C:
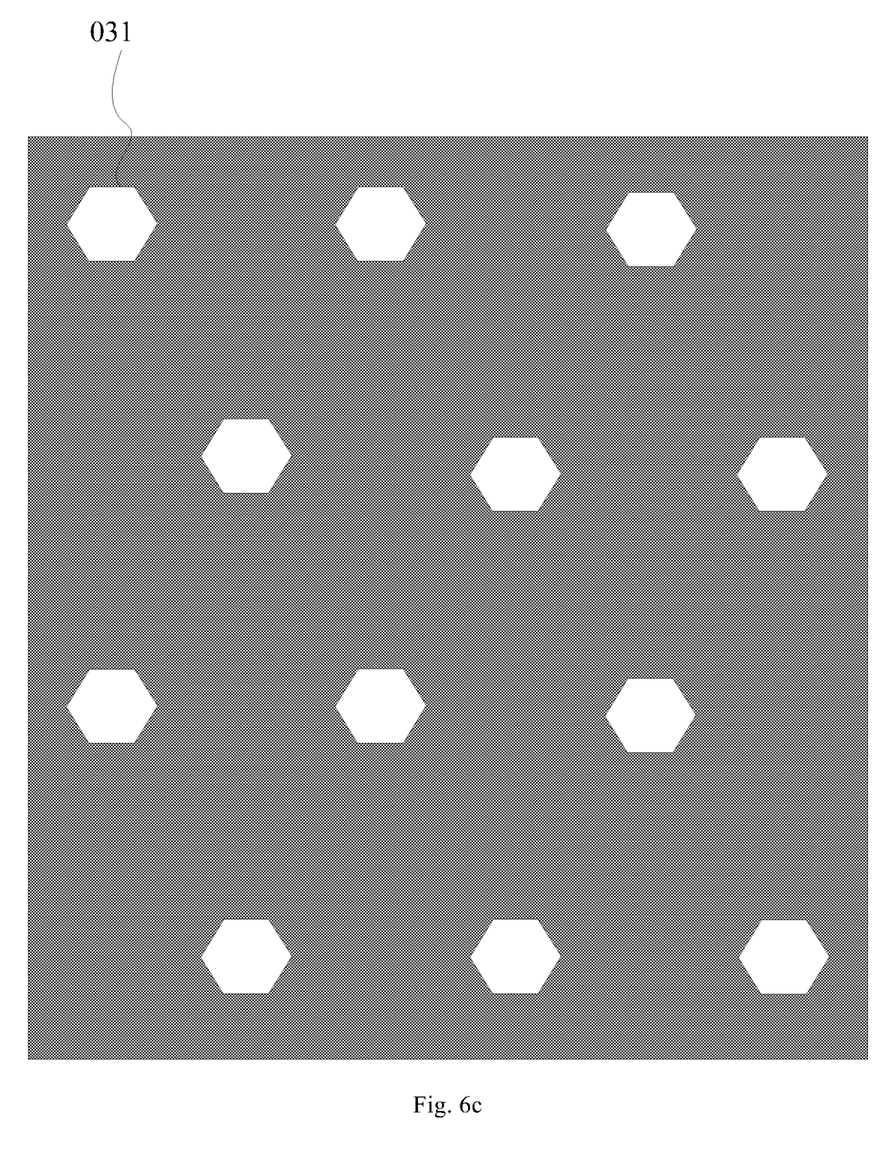
FIG. 6c is a schematic structural diagram of a high-precision mask corresponding to third sub-pixels according to an embodiment of the present disclosure.

Based on the same inventive concept, an embodiment of the present disclosure further provides a high-precision metal mask, which is used for manufacturing the above-mentioned pixel arrangement structure provided by the embodiments of the present disclosure. As shown in FIGS. 6*a* to 6*c*, the masks include a plurality of opening regions 011, 021 or 031. As shown in FIG. 6*a*, the opening regions 011 correspond to the shapes and positions of the first sub-pixels 01. As shown in FIG. 6*b*, the opening regions 021 correspond to the shapes and positions of the second sub-pixels 02. As shown in FIG. 6*c*, the opening regions 013 correspond to the shapes and positions of the third sub-pixels 03.

Specifically, FIG. 6*a* shows a structure of a high-precision mask (FMM) for fabricating the first sub-pixels 01 in FIG. 4. FIG. 6*b* shows a structure of a high-precision mask (FMM) for fabricating the second sub-pixels 02 in FIG. 4. FIG. 6*c* shows a structure of a high-precision mask (FMM) for fabricating the third sub-pixels 03 in FIG. 4. It can be seen that the opening regions in FIGS. 6*a* to 6*c* are evenly distributed on the mask plate, and the stress distribution of the organic materials can be made uniform during the vapor deposition process, thereby reducing the difficulty of vapor deposition.

In one embodiment, when the above-mentioned pixel arrangement structure is formed by using the above-described high-precision metal mask, each high-precision metal mask as shown in FIGS. 6*a* to 6*c* is combined with a Cover Mask, a Howling Mask, and an Align Mask to form a MFA. Then, the combined MFA is placed in a corresponding evaporation chamber to vapor-deposit an organic light-emitting material corresponding to the sub-pixel. In the specific implementation, only one type of sub-pixel pattern can be formed at a time. After forming a sub-pixel pattern, another sub-pixel pattern is formed. After the three sub-pixel patterns are sequentially formed, the pixel arrangement structure shown in FIG. 4 is obtained.

Based on the same inventive concept, an embodiment of the present disclosure further provides a display apparatus including any one of the above pixel arrangement structures provided by the embodiments of the present disclosure. The display apparatus may be any product or component having a display function such as a mobile phone, a tablet computer, a television, a monitor, a notebook computer, a digital photo frame, a navigator, and the like. For the implementation of the display apparatus, reference may be made to the above embodiment of the display panel, and the repeated description is omitted.

A pixel arrangement structure, a high-precision metal mask, and a display apparatus are provided by the embodiments of the present disclosure. In the pixel arrangement structure, the second sub-pixels and the third sub-pixels are alternately arranged on the vertices of the virtual hexagon. The first sub-pixel is located at the center of the virtual hexagon. The adjacent virtual hexagons are arranged in such a way that they share one common side. When displayed, the first sub-pixel located at the center of the virtual hexagon together with the third sub-pixel and the second sub-pixel located at any two adjacent vertices of the virtual hexagon may form one light-emitting pixel point. As such, the sub-pixels can achieve high resolution display effect from the low physical resolution based on principle of color-borrowing.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A pixel arrangement structure, comprising a plurality of repeating units,
wherein:
each of the plurality of the repeating units comprises a first sub-pixel being at a center point of a virtual hexagon and second sub-pixels and third sub-pixels being alternately arranged at vertices of the virtual hexagon;
virtual hexagons of adjacent repeating units share one common side as well as two sub-pixels on the common side;
the two sub-pixels on the common side and the first sub-pixel at the center point form a light-emitting pixel, the two sub-pixels on the common side and another first sub-pixel at a neighboring center point of a neighboring virtual hexagon form another light-emitting pixel, and the virtual hexagon and the neighboring virtual hexagon share the common side;
an area of the first sub-pixel is larger than an area of the second sub-pixel, the area of the first sub-pixel is larger than an area of the third sub-pixel, the first sub-pixel is a red sub-pixel, the second sub-pixel is a green sub-pixel, and the third sub-pixel is a blue sub-pixel; and
the pixel arrangement structure includes data lines and a plurality of first sub-pixels, and the plurality of first sub-pixels in rows are separated each other by two data lines.

2. The pixel arrangement structure according to claim 1, wherein in the virtual hexagon, a minimum distance between the first sub-pixel and the second sub-pixel is equal to a minimum distance between the first sub-pixel and the third sub-pixel.

3. The pixel arrangement structure according to claim 1, wherein in the virtual hexagon, a minimum distance between every adjacent second sub-pixel and third sub-pixel is equal.

4. The pixel arrangement structure according to claim 1, wherein in the virtual hexagon, opposite sides of the adjacent first sub-pixel and second sub-pixel are parallel to each other.

5. The pixel arrangement structure according to claim 1, wherein in the virtual hexagon, opposite sides of the adjacent first sub-pixel and third sub-pixel are parallel to each other.

6. The pixel arrangement structure according to claim 1, wherein in the virtual hexagon, opposite sides of the adjacent second sub-pixel and third sub-pixel are parallel to each other.

7. The pixel arrangement structure according to claim 1, wherein the virtual hexagon is a virtual regular hexagon.

8. The pixel arrangement structure according to claim 1, wherein the area of the second sub-pixel is equal to the area of the third sub-pixel.

9. The pixel arrangement structure according to claim 1, wherein the area of the third sub-pixel is larger than the area of the second sub-pixel.

10. The pixel arrangement structure according to claim 1, wherein the first sub-pixel, the second sub-pixel, and the third sub-pixel each have a shape of polygon.

11. The pixel arrangement structure according to claim 1, wherein the first sub-pixel, the second sub-pixel, and the third sub-pixel each have a shape of hexagon.

12. The pixel arrangement structure according to claim 11, wherein placement angles of the first sub-pixel, the second sub-pixel, and the third sub-pixel are the same.

13. The pixel arrangement structure according to claim 1, wherein the first sub-pixel, the second sub-pixel, and the third sub-pixel each have a different shape.

14. A high-precision metal mask for fabricating the pixel arrangement structure according to claim 1, comprising a plurality of opening regions, wherein the opening regions correspond to shapes and positions of one set of the first sub-pixels, the second sub-pixels or the third sub-pixels.

15. A display apparatus, comprising the pixel arrangement structure according to claim 1.

* * * * *